United States Patent
Cho

(10) Patent No.: US 7,309,656 B2
(45) Date of Patent: Dec. 18, 2007

(54) METHOD FOR FORMING STEP CHANNEL OF SEMICONDUCTOR DEVICE

(75) Inventor: Young Man Cho, Gyeonggi-do (KR)

(73) Assignee: Hynix Semiconductors, Inc., Gyeonggi-do (KR)

( * ) Notice: Subject to any disclaimer, the term of this patent is extended or adjusted under 35 U.S.C. 154(b) by 70 days.

(21) Appl. No.: 11/148,558

(22) Filed: Jun. 9, 2005

(65) Prior Publication Data

US 2006/0141800 A1    Jun. 29, 2006

(30) Foreign Application Priority Data

Dec. 28, 2004    (KR) .................. 10-2004-0113864

(51) Int. Cl.
*H01L 21/302* (2006.01)
(52) U.S. Cl. .................. 438/718; 438/736; 438/740; 438/743; 438/744
(58) Field of Classification Search ................ 438/718, 438/736, 740, 743, 744
See application file for complete search history.

(56) References Cited

U.S. PATENT DOCUMENTS

| | | | |
|---|---|---|---|
| 5,751,040 A | 5/1998 | Chen et al. | |
| 5,908,313 A * | 6/1999 | Chau et al. | 438/299 |
| 6,580,134 B1* | 6/2003 | Song et al. | 257/384 |
| 6,753,242 B2 | 6/2004 | Yeap et al. | |
| 2004/0212009 A1* | 10/2004 | Wang et al. | 257/317 |
| 2006/0014354 A1* | 1/2006 | Chen et al. | 438/369 |
| 2006/0110880 A1* | 5/2006 | Yuan | 438/257 |

FOREIGN PATENT DOCUMENTS

KR    1020010037863 A    5/2001

OTHER PUBLICATIONS

Semiconductor Glossary; http://www.semiconductorglossary.com/default.asp?searchterm=etch+mask; pp. 1-2; 2001.*

* cited by examiner

*Primary Examiner*—Binh Tran
(74) *Attorney, Agent, or Firm*—Hynix Semiconductors; Heller Ehrman L.L.P.; Johnny A. Kumar

(57) ABSTRACT

A method for forming a step channel of a semiconductor device is disclosed. The method for forming a step channel of a semiconductor device comprises forming a hard mask layer pattern defining a step channel region on a semiconductor substrate, forming a spacer on a sidewall of the hard mask layer pattern, and simultaneously etching the spacer and a predetermined thickness of the semiconductor substrate using the hard mask layer pattern and the spacer as an etching mask.

12 Claims, 4 Drawing Sheets

METHOD FOR FORMING STEP CHANNEL OF SEMICONDUCTOR DEVICE

BACKGROUND OF THE INVENTION

1. Field of the Invention

The present invention generally relates to a method for forming a step channel of a semiconductor device, and more specifically, to a method for forming a step channel of a semiconductor device wherein a spacer is formed on a sidewall of a hard mask layer pattern, and a step channel region having a sloped profile is formed using the hard mask layer pattern and the spacer as an etching mask to prevent damage to a semiconductor substrate during a plasma etching process and improve a sharp profile of the step channel region, thereby improving operating characteristics and yield of the semiconductor device.

2. Description of the Related Art

FIGS. 1a and 1b illustrate a conventional method for forming a step channel of a semiconductor device.

Referring to FIG. 1a, a photoresist film pattern 20 defining a step channel region is formed on a semiconductor substrate 10. The semiconductor substrate 10 is etched via a plasma etching process using the photoresist film pattern 20 as an etching mask.

Referring to FIG. 1b, the photoresist film pattern 20 is removed to form the step channel region. The edge portion of the step channel region which is denoted as 'A', is damaged due to the plasma etching process, thereby rendering the upper edge portion and the lower edge portion of the step channel region to have sharp profiles.

In accordance with the above-described conventional method for forming a step channel of a semiconductor device, the damage to the step channel region due to the plasma etching process causes the upper portion and the lower portion thereof to have the sharp profiles, which results in degradation of the operating characteristics and yield of the semiconductor device.

SUMMARY OF THE INVENTION

Accordingly, it is an object of the present invention to provide a method for forming a step channel of a semiconductor device wherein a spacer is formed on a sidewall of a hard mask layer pattern, and a step channel region having a sloped profile is formed using the hard mask layer pattern and the spacer as an etching mask to prevent damage to a semiconductor substrate during a plasma etching process and improve a sharp profile of the step channel region, thereby improving operating characteristics and yield of the semiconductor device.

In order to achieve the above object of the present invention in accordance with a first preferred embodiment, there is provided a method for forming a step channel of a semiconductor substrate comprising the steps of:

(a) forming a hard mask layer pattern defining a step channel region on a semiconductor substrate, (b) forming a spacer on a sidewall of the hard mask layer pattern, and (c) simultaneously etching the spacer and a predetermined thickness of the semiconductor substrate using the hard mask layer pattern and the spacer as an etching mask.

In order to achieve above object of the present invention in accordance with a second preferred embodiment, there is provided a method for forming a step channel of a semiconductor device, comprising the steps of:

(a) forming a stacked structure of an etch barrier oxide film pattern and a hard mask layer pattern on a semiconductor substrate, the stacked structure defining a step channel region, (b) forming a spacer on a sidewall of the stacked structure, and (c) simultaneously etching the spacer, the hard mask layer pattern and a predetermined thickness of the semiconductor substrate using the stacked structure and the spacer as an etching mask.

DETAILED DESCRIPTION OF THE PREFERRED EMBODIMENTS

Reference will now be made in detail to exemplary embodiments of the present invention. Wherever possible, the same reference numbers will be used throughout the drawings to refer to the same or like parts.

FIGS. 2a through 2d illustrate a method for forming a step channel of a semiconductor device according to a first preferred embodiment of the present invention.

Figure 1A:
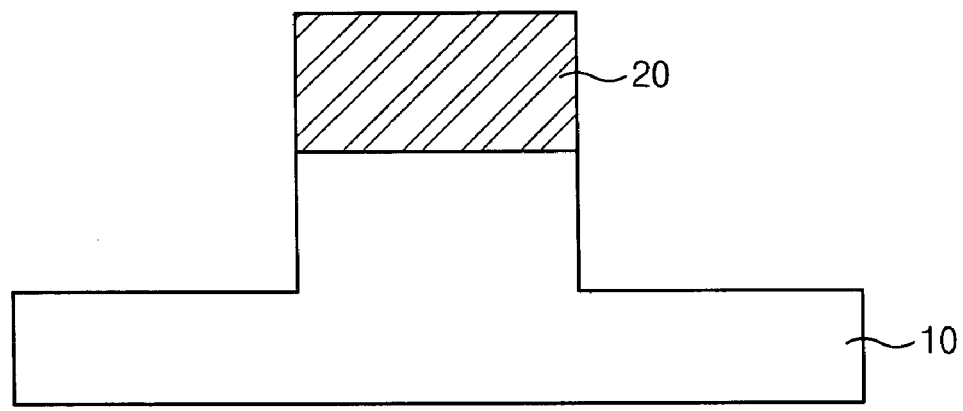
FIGS. 1a and 1b are cross-sectional views illustrating a conventional method for forming a step channel of a semiconductor device.
Figure 1B:
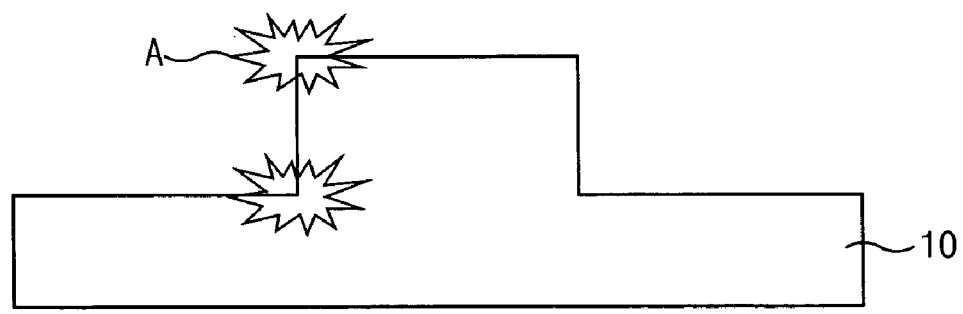
Figure 2A:
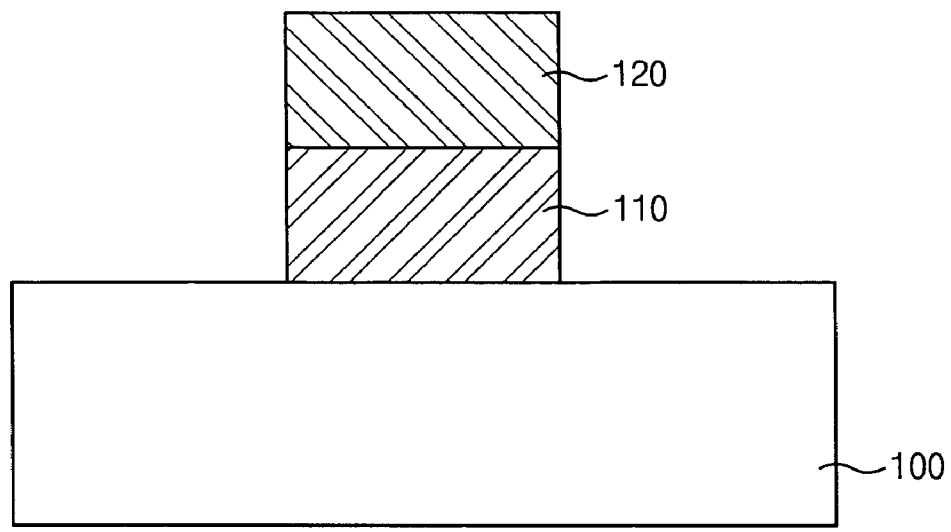
FIGS. 2a through 2d are cross-sectional views illustrating a method for forming a step channel of a semiconductor device in accordance with a first preferred embodiment of the present invention.

Referring to FIG. 2a, a hard mask layer (not shown) is formed on a semiconductor substrate 100. A photoresist film pattern 120 defining a step channel region is then formed on the hard mask layer.

Next, the hard mask layer is etched using the photoresist film pattern 120 as an etching mask to form a hard mask layer pattern 110.

Preferably, the hard mask layer pattern 110 comprises a nitride film, a tungsten film, a titanium film, a titanium nitride film or combinations thereof. In addition, a thickness of the hard mask layer pattern 110 is substantially the same as that of the semiconductor substrate etched in the etching process of the semiconductor substrate 100 for forming the step channel region shown in FIG. 2c.

Figure 2B:
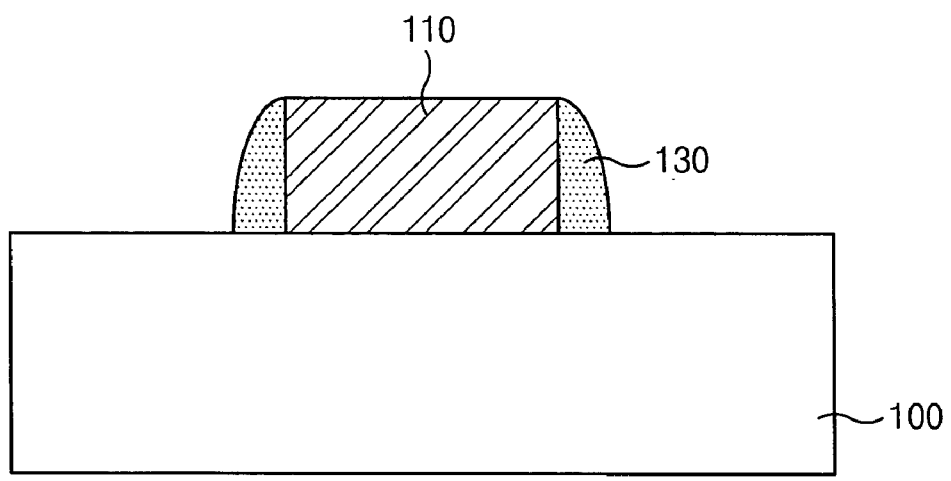

Referring to FIG. 2b, the photoresist film pattern 120 is removed. Thereafter, a spacer 130 is formed on a sidewall of the hard mask layer pattern 110. The spacer 130 preferably comprises a polysilicon layer or an oxide film.

Figure 2C:
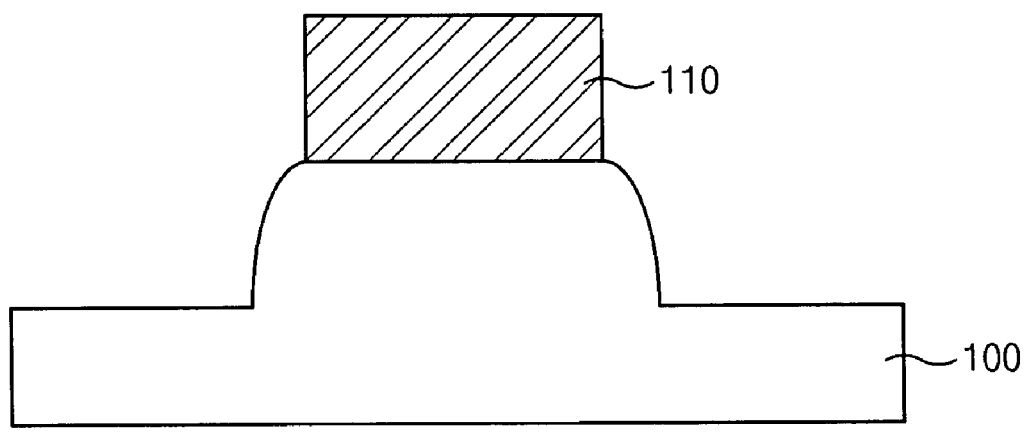

Referring to FIG. 2c, the spacer 130 and the semiconductor substrate 100 are simultaneously etched using the hard mask layer pattern 110 and the spacer 130 as an etching mask.

Preferably, the etching process of the spacer 130 and the semiconductor substrate 100 is performed via a dry-etching method having the same etch rate over the spacer 130 and the semiconductor substrate 100. Accordingly, the etched semiconductor substrate 100 in the step channel region has a sloped profile.

Figure 2D:
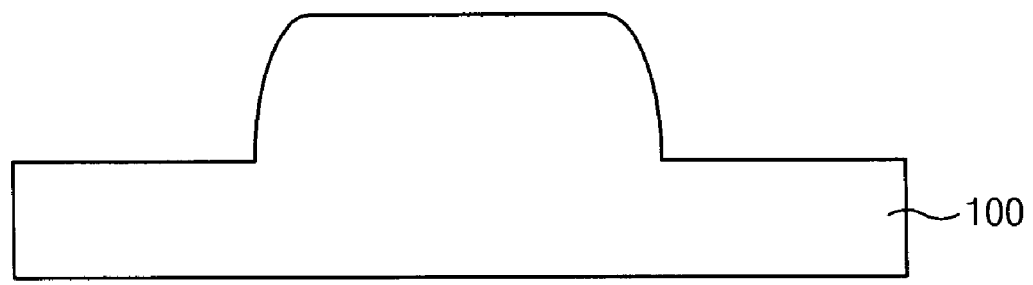

Referring to FIG. 2d, the hard mask layer pattern 110 is removed to form the step channel region having a sloped profile. Here, the removal process of a remaining portion of the hard mask layer pattern 110 is preferably performed using a wet-etching method.

Figure 3A:
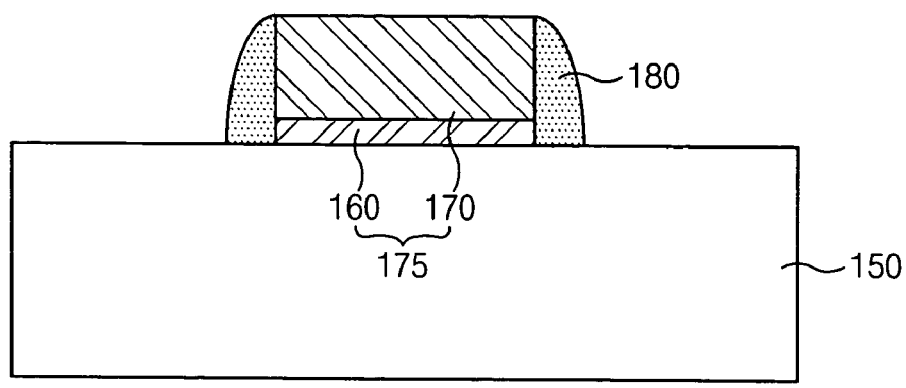
FIGS. 3a through 3c are cross-sectional views illustrating a method for forming a step channel of a semiconductor device in accordance with a second preferred embodiment of the present invention.
Figure 3B:
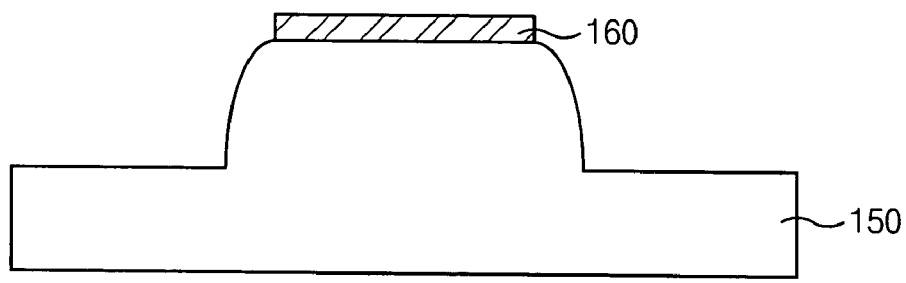
Figure 3C:
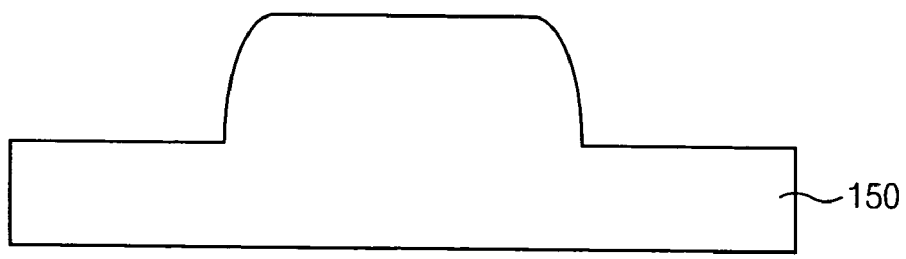

FIGS. 3*a* through 3*c* illustrate a method for forming a step channel of a semiconductor device according to a second preferred embodiment of the present invention.

Referring to FIG. 3*a*, an etch stop oxide film (not shown) and a hard mask layer (not shown) are formed on a semiconductor substrate 150. Thereafter, a photoresist film pattern (not shown) defining a step channel region is formed on the hard mask layer.

Next, the etch stop oxide film and the hard mask layer are etched using the photoresist film pattern as an etching mask to form a stacked structure 175 of an etch stop oxide film pattern 160 and a hard mask layer pattern 170.

Thereafter, the photoresist film pattern on the stacked structure 175 is removed. Thereafter, a spacer 180 is formed on a sidewall of the stacked structure 175.

Preferably, the etch stop oxide film pattern 160 comprises a high temperature oxidation film, a tetra-ethyl-ortho-silicate film, an undoped silicate glass film, a boro phosphor silicate glass film or combinations thereof. Preferably, the hard mask layer pattern 170 and the spacer 180 comprise a polysilicon layer, respectively.

In addition, a thickness of the stacked structure 175 is substantially the same as that of the semiconductor substrate etched in the etching process of the semiconductor substrate 150 for forming the step channel region shown in FIG. 3*c*.

Referring to FIG. 3*b*, the spacer 180, the hard mask layer pattern 170 and the semiconductor substrate 150 are simultaneously etched using the stacked structure 175 and the spacer 180 as an etching mask.

Preferably, the etch stop oxide film pattern 160 has an etch rate different from those of the hard mask layer pattern 170 and the semiconductor substrate 150, so that the etch stop oxide film pattern 160 is not simultaneously etched.

On the other hand, the etching process for the spacer 180, the hard mask layer pattern 170 and the semiconductor substrate 150 is preferably performed using a dry-etching method having the same etch rate with respect to the spacer 180 and the hard mask layer pattern 170 and the semiconductor substrate 150. Accordingly, the etched semiconductor substrate 150 of the step channel region has a sloped profile.

Referring to FIG. 3*c*, the etch stop oxide film pattern 160 is removed to form the step channel region having the sloped profile. The removal process of the etch stop oxide film pattern 160 is preferably performed using a wet-etching method.

As described above, the method for forming a step channel of a semiconductor device provides improved operating characteristics and yield of the semiconductor device by forming the sloped step channel region using the spacer on the sidewall of the hard mask layer pattern as an etching mask, thereby preventing the damage to the semiconductor substrate of the step channel region due to the plasma etching process and improving the sharp profile of the step channel region.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for forming a step channel of a semiconductor device, comprising the steps of:
    (a) forming a hard mask layer pattern for defining a step channel region on a semiconductor substrate;
    (b) forming a spacer on a sidewall of the hard mask layer pattern; and
    (c) simultaneously etching the spacer and a predetermined thickness of the semiconductor substrate using the hard mask layer pattern as an etching mask to form the step channel region having a sloped profile,
    wherein during the etching process for the spacer and the semiconductor substrate, a portion of the spacer is etched while the remaining portion of the spacer is used as an etching mask.

2. The method according to claim 1, wherein the hard mask layer pattern is selected from the group consisting of a nitride film, a tungsten film, a titanium film, a titanium nitride film and combinations thereof.

3. The method according to claim 1, wherein the predetermined thickness of the semiconductor substrate is substantially the same as that of the hard mask layer pattern.

4. The method according to claim 1, wherein the spacer comprises one of a polysilicon layer and an oxide film.

5. The method according to claim 1, wherein the etching process in the step (c) is performed via a dry-etching method having the same etch rate for the spacer and the semiconductor substrate.

6. The method according to claim 1, further comprising removing the hard mask layer pattern using a wet-etching method.

7. A method for forming a step channel of a semiconductor device, comprising the steps of:
    (a) forming a stacked structure of an etch barrier oxide film pattern and a hard mask layer pattern on a semiconductor substrate, the stacked structure defining a step channel region;
    (b) forming a spacer on a sidewall of the stacked structure; and
    (c) simultaneously etching the spacer, the hard mask layer pattern and a predetermined thickness of the semiconductor substrate using the etch barrier oxide film pattern as an etching mask to form the step channel region having a sloped profile,
    wherein during the etching process for the spacer, the hard mask layer pattern and the semiconductor substrate, a portion of the spacer is etched while the remaining portion of the spacer is used as an etching mask.

8. The method according to claim 7, wherein the etch barrier oxide film pattern is selected from the group consisting of a high temperature oxidation ("HTO") film, a tetra-ethyl-ortho-silicate ("TEOS") film, an undoped silicate glass ("USG") film, a boro phosphor silicate glass ("BPSG") film and combinations thereof.

9. The method according to claim 7, wherein the hard mask layer pattern and the spacer comprise a polysilicon layer, respectively.

10. The method according to claim 7, wherein the predetermined thickness of the semiconductor substrate is substantially the same as that of the stacked structure.

11. The method according to claim 7, wherein the etching process of the step (c) is performed via a dry-etching method having the same etch rate for the spacer, the hard mask layer pattern and the semiconductor substrate.

12. The method according to claim 7, further comprising removing the etch barrier layer pattern using a wet-etching method.

* * * * *